United States Patent
Manweiler et al.

(10) Patent No.: US 6,459,589 B2
(45) Date of Patent: *Oct. 1, 2002

(54) COMPUTER CHASSIS ASSEMBLY WITH A SINGLE CENTER PLUGGABLE MIDPLANE BOARD

(75) Inventors: Kurt A. Manweiler, Tomball; Thomas T. Hardt, Missouri City; Michael C. Sanders, Spring, all of TX (US)

(73) Assignee: Compaq Information Technologies Group LLP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/817,851

(22) Filed: Mar. 26, 2001

Related U.S. Application Data

(63) Continuation of application No. 09/249,506, filed on Feb. 12, 1999, now Pat. No. 6,208,522.

(51) Int. Cl.[7] .................................................. H05H 7/20
(52) U.S. Cl. ...................... 361/752; 361/796; 361/727; 439/928
(58) Field of Search ................................ 361/683–686, 361/725–727, 752, 796, 788, 601, 622, 627, 633, 640, 679, 791; 439/61, 928

(56) References Cited

U.S. PATENT DOCUMENTS

| | | | |
|---|---|---|---|
| 5,027,254 A | 6/1991 | Corfits et al. | 361/384 |
| 5,031,070 A | 7/1991 | Hsu | 361/380 |
| 5,297,000 A | 3/1994 | Freige et al. | 361/692 |
| 5,805,412 A | * 9/1998 | Yanagisawa et al. | 361/686 |
| 5,808,876 A | 9/1998 | Mullenbach et al. | 361/788 |
| 5,822,182 A | * 10/1998 | Schoder et al. | 361/683 |
| 5,822,185 A | * 10/1998 | Cavello | 361/686 |

* cited by examiner

Primary Examiner—Darren Schuberg
Assistant Examiner—Hung Van Duong

(57) ABSTRACT

A modularized computer chassis for housing multiple computer modules, such as a processor module, media storage module, an I/O module, and power supplies includes a housing divided generally into four regions, with each region configured for receiving one of the modules or power supplies. A single center pluggable midplane board is positioned in the middle of the housing such that each of the modules and power supplies can be interconnected through the single midplane board. The single center pluggable midplane board includes direct pluggable connectors which correspond to connectors on each of the modules and power supplies, such that each of the modules and power supplies are directly connected to the single pluggable midplane board, and no ribbon signal and power cables are needed for the connection. The direct connection between the single center pluggable midplane board and the modules and power supplies helps to minimize the height of the chassis, thereby saving valuable rack space.

32 Claims, 12 Drawing Sheets

COMPUTER CHASSIS ASSEMBLY WITH A SINGLE CENTER PLUGGABLE MIDPLANE BOARD

This application is a Continuation of application Ser. No. 09/249,506, filed Feb. 12, 1999 now U.S. Pat. No. 6,208,522.

FIELD OF THE INVENTION

The present invention relates to a computer chassis, and more particularly, but not by way of limitation, to a computer chassis constructed to receive multiple modular components and further with a single center pluggable midplane board for cable-less connection of the modular components.

BACKGROUND OF THE INVENTION

Early computer designs generally included a chassis with a plurality of individual components and assemblies mounted therein and connected to one another by means of wires, cables, brackets, nuts, bolts and the like. A major computer design advance occurred with the advent of printed circuit boards, integrated circuits and modular component assemblies. The printed circuit boards were, for example, formed of lightweight material and housed a myriad of components which were electrically interconnected with the component assemblies through wiring harnesses. The wiring harnesses and hard wire connections were subsequently replaced by technologically advanced connectors used for integrally coupling the individual components to each other and to other circuitry in the computer.

In the design of electronic equipment, the use of connectors, modular components, and specialized hardware has permitted key components and printed circuit boards to be efficiently added and removed. Such ease in the addition and deletion of computer components and printed circuit boards has facilitated assembly, repair, upgrade and/or changes in functionality.

Computer reliability and serviceability are also valuable design aspects. Originally, a rule of practice in the maintenance of electrical circuitry, such as computer hardware, was that of always turning the power to the computer off before components or printed circuit boards were added or removed from the computer chassis or support frame. Recent innovations have addressed the desirability to insert and remove modular components and printed cards from electrical equipment, such as computer hardware, when the computer is electrically connected and operational, i.e. "hot." It is now possible for the power to be disconnected from only the connector of the drive or modular component to be removed or inserted while allowing the adjacent components to remain "hot."

Removable computer components today include disc drives, drive cages, fans, power supplies, system I/O modules, processor boards, and other subassemblies. As referenced above, the removability of computer components allows for better overall serviceability of the computer system, which is a distinct advantage to both the user and the maintenance technician. A defective power supply in the main or central computer generally requires prompt replacement in order to limit downtime. It is for this reason that modular components and connectors facilitate prompt replacement and are thus popular in many computer designs.

The modularity of computer systems is thus recognized as an important design consideration. As mentioned above, modules can be removed and examined for operability or other purposes much easier than permanently mounted fixtures within a computer chassis. Because computers provide an integral part of most business operations, it is of utmost importance to maintain the reliability and integrity of the computer system. When the various elements of a computer can be easily removed in a modular form, they can also be replaced to maintain the operational status of the computer.

Many existing design approaches for these types of computer chassis configured to receive modular computer components utilizes ribbon cables to connect interconnect the various modules. This requires the computer chassis to be large enough for a user to be able to reach into the chassis, behind the modules to be able to connect and disconnect the modules. This therefore, requires a larger form factor, thereby taking up valuable rack space.

Therefore, as can be appreciated there is a need for a computer chassis configured to receive modular computer components that can be readily serviced and upgraded, and that also has a minimum form factor.

SUMMARY OF THE INVENTION

The present invention overcomes the above identified problems as well as other shortcomings and deficiencies of existing technologies by providing a computer chassis configured to receive modular components that can be readily serviced and upgraded, and that also has a minimum form factor.

The present invention further provides a modularized computer chassis for housing multiple computer modules, such as a processor module, media storage module, an I/O module, and power supplies. The chassis includes a housing divided generally into four regions, with each region configured for receiving one of the modules or power supplies. A single center pluggable midplane board is positioned in the middle of the housing such that each of the modules and power supplies can be interconnected through the single midplane board. The single center pluggable midplane board includes direct pluggable connectors which correspond to connectors on each of the modules and power supplies, such that each of the modules and power supplies are directly connected to the single pluggable midplane board, and such that no ribbon signal and power cables are needed for the connection. The direct connection between the single center pluggable midplane board and the modules and power supplies helps to minimize the height of the chassis, thereby saving valuable rack space.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
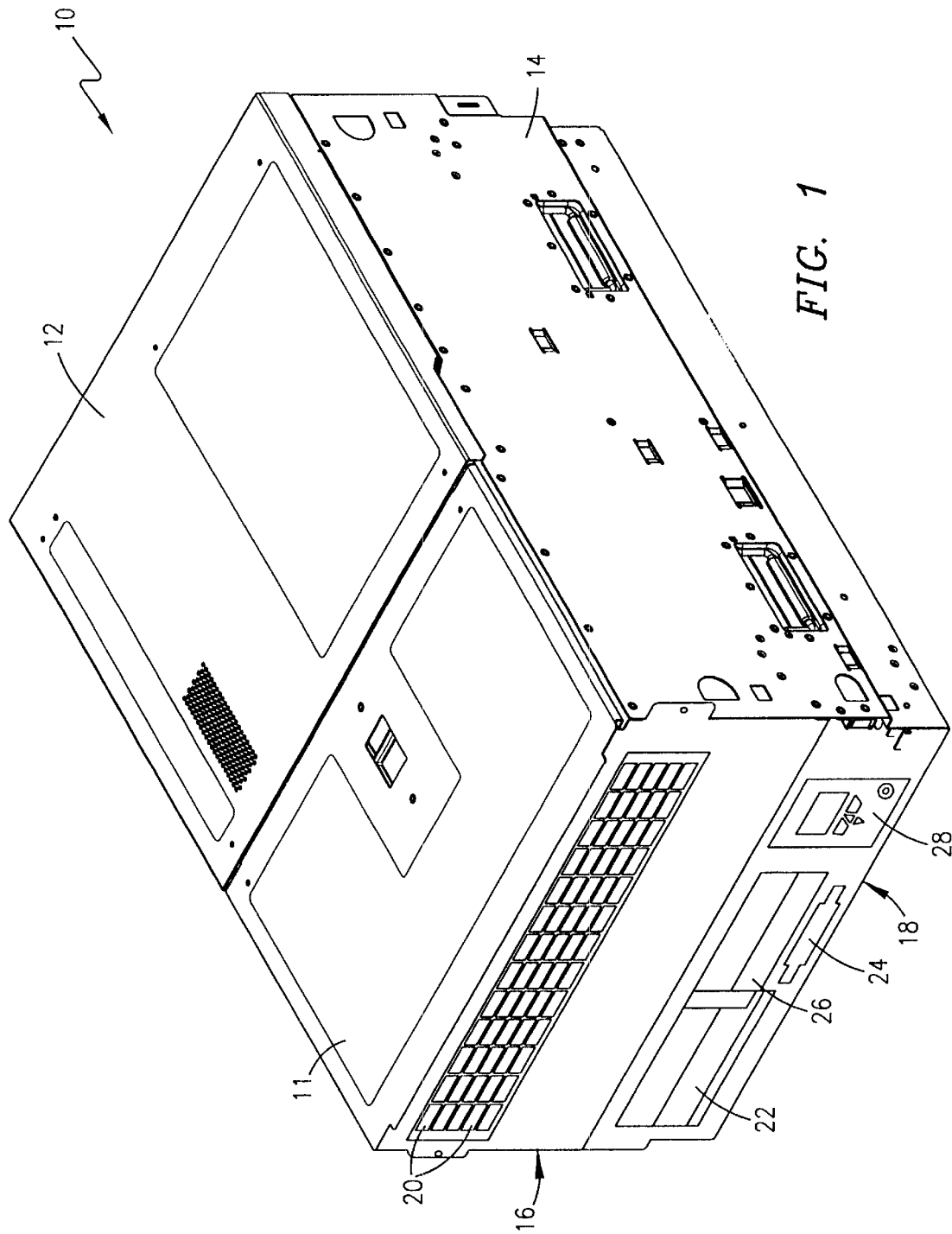
FIG. 1 is a frontal, right side perspective view of a computer chassis constructed in accordance with the principles of the present invention.

Referring now to the drawings wherein like or similar elements are designated with identical reference numerals throughout the several views, and wherein the various elements depicted are not necessarily drawn to scale, and in particular, to FIG. 1, there is shown a front perspective view of a computer chassis 10 constructed in accordance with the principles of the present invention. In an exemplary embodiment of the present invention, computer chassis 10 is configured as a server chassis that is rack mountable. As illustrated, computer chassis 10 includes a fixedly attached top panel 11, and a slidably removable top panel 12, a side panel 14, a removable processor module 16, and a removable media drive module 18. Processor module 16 includes vents 20 for permitting airflow to be drawn over the components therein for cooling purposes.

As further depicted in FIG. 1, media drive module 18 includes media storage devices, such as hard drives 22, floppy drive 24, and CD-ROM drive 26. In this particular embodiment media drive module 18 includes a display unit 28 which is used to monitor and interact with system operations.

Figure 2:
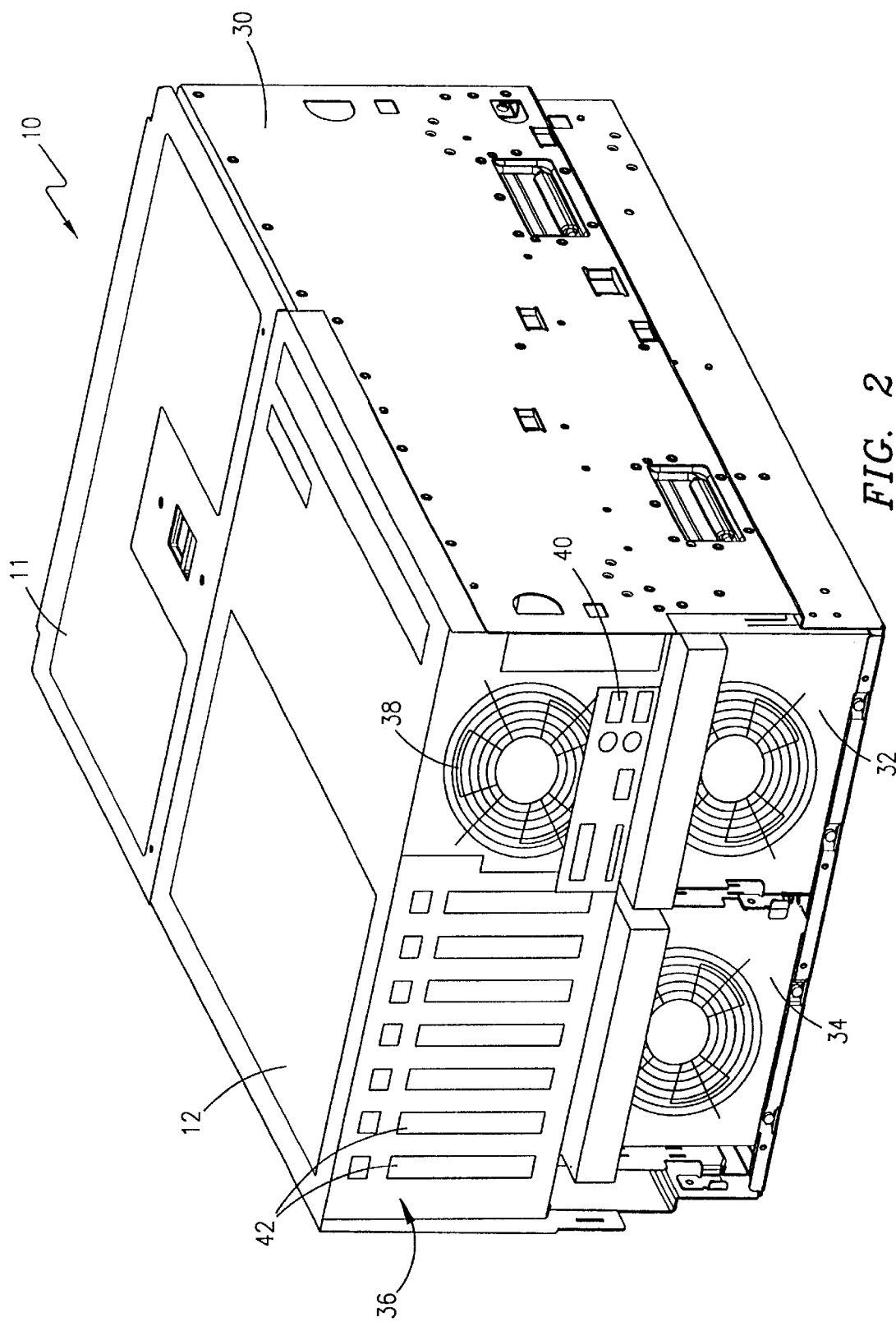
FIG. 2 is a rear left side perspective view of a computer chassis in accordance with the principles of the present invention as similarly shown in FIG. 1.

Referring now to FIG. 2, there is illustrated a rear perspective view of the computer chassis 10. As depicted computer chassis 10 further includes a side panel 30, removable hot-pluggable power supplies 32 and 34, and a removable Input/Output (I/O) module 36. In this exemplary embodiment I/O module 36 includes dual in-line cooling fans, although only cooling fan 38 is identifiable in FIG. 2. I/O module 36 further provides typical I/O functionality such as I/O ports 40, which includes parallel and serial ports and the like. I/O module 36 also includes expansion slots 42 for receiving various computer peripheral components.

Figure 3:
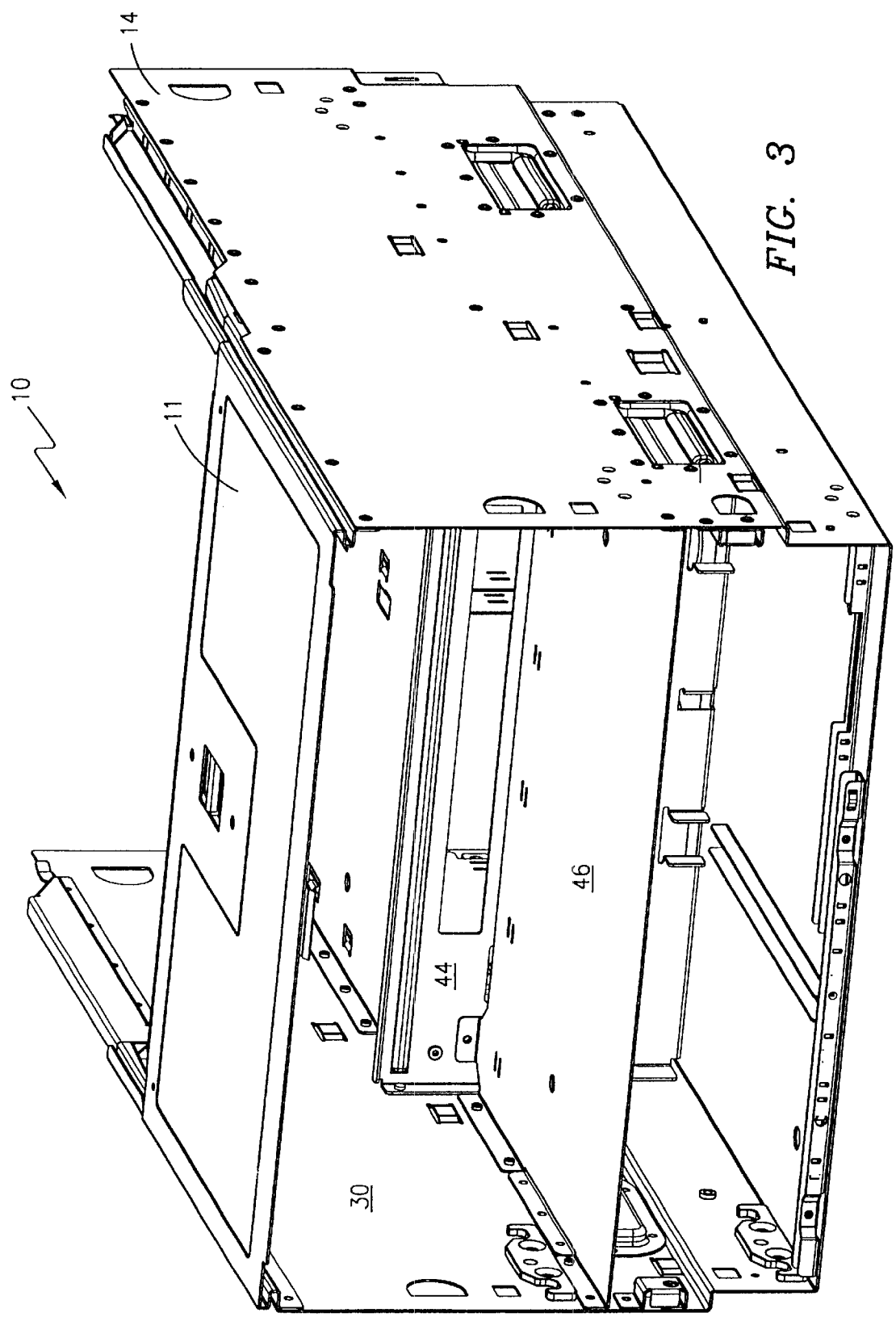
FIG. 3 is a front perspective view of a computer chassis in accordance with the principles of the present invention as similarly shown in FIG. 1 with the modules and top panel removed.

Referring now to FIG. 3, there is illustrated a front perspective view of chassis 10 with each of processor module 16, media drive module 18, I/O module 36 and the power supplies 34 removed therefrom, and the top panel 14 removed from the top of chassis 10. As illustrated, chassis 10 further includes a center support 44 to which the single midplane board (see FIGS. 9–12 described herein below) is secured. The midplane board is utilized to interconnect the various modules and power supplies within the computer chassis 10 without any ribbon signal and power cables. A module divider 46 is secured to side panels 14 and 30 and is used to separate the area of chassis 10 that receives processor module 16 from the area of chassis 10 that receives media drive module 18.

Figure 4:
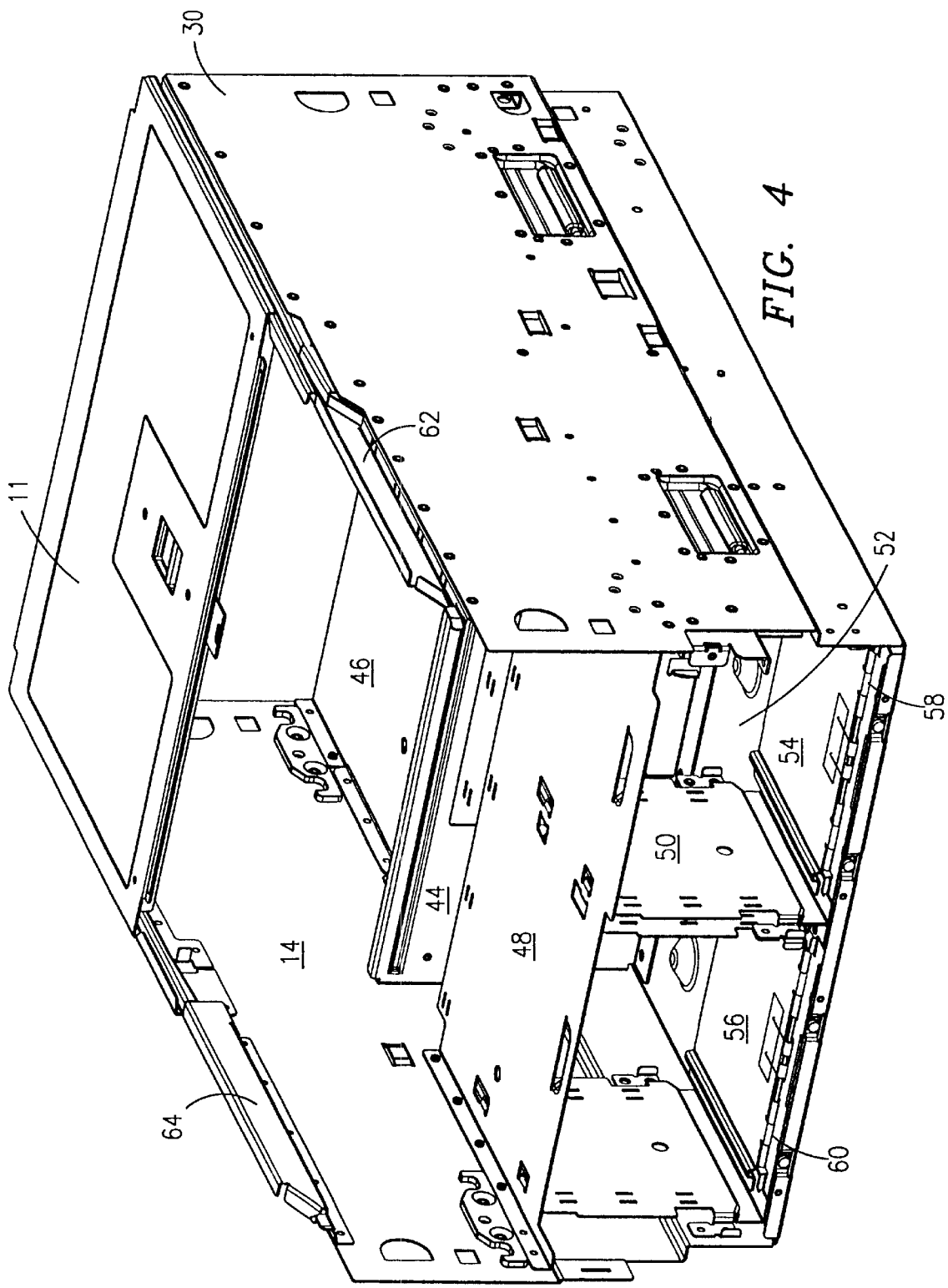
FIG. 4 is a rear, left side perspective view of the computer chassis as similarly shown in FIG. 3.

Referring now to FIG. 4, there is illustrated a rear perspective view of computer chassis 10 with each of the processor module 16, media drive module 18, I/O module 36 and the power supplies 34 removed therefrom, and the top panel 14 removed from the top. A module divider 48 is secured to side panels 14 and 30, and is used to separate the area of chassis 10 that receives the I/O processor module 36 and power supplies 34. A power supply divider 50 is connected to the base 52 of computer chassis and module divider 48, and is used to separate the area of chassis 10 that receives the power supplies 34.

Still referring FIG. 4, two power supply doors 54 and 56 and connected to base 52 of chassis 10 with spring hinges 58 and 60, respectively. Although illustrated in the down or open position for clarity reasons, power supply doors 54 and 56 are normally biased in the closed position when a power supply is not inserted into chassis 10. Among other things, power supply doors 54 and 56, when closed, help prevent improper air flow through chassis 10, thereby improving cooling efficiency of the various modules.

Still referring to FIG. 4, chassis 10 includes tracks 62 and 64, which mate with the edges of top panel 12. Tracks 62 and 64 permit top panel 12 to be slid or moved from above I/O module 36, over fixed top panel 11. This permits quick and easy access to I/O module 36 and it components, as well access to the midplane board.

Figure 5:
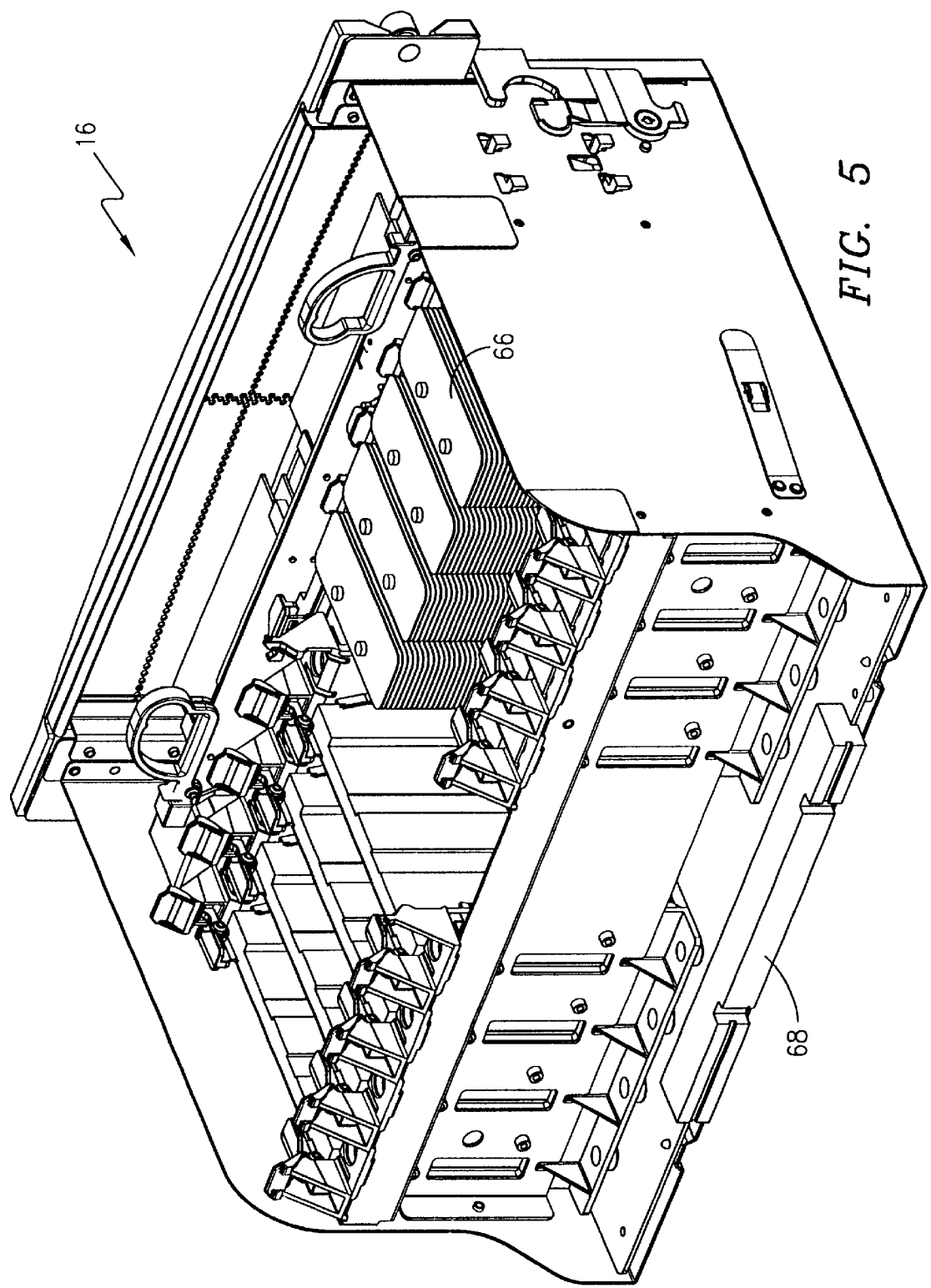
FIG. 5 is a rear perspective view of a processor module in accordance with the principles of the present invention.

Referring now to FIG. 5, there is illustrated a rear perspective view of processor module 16. Processor module 16 has multiple slots to receive multiple processors, such as processor 66 and multiple memory devices. Each of the processors and memory devices of processor module 16 interface with the components of other modules of chassis 10 through processor module connector 68, as well as obtain power from power supplies 34.

Figure 6:
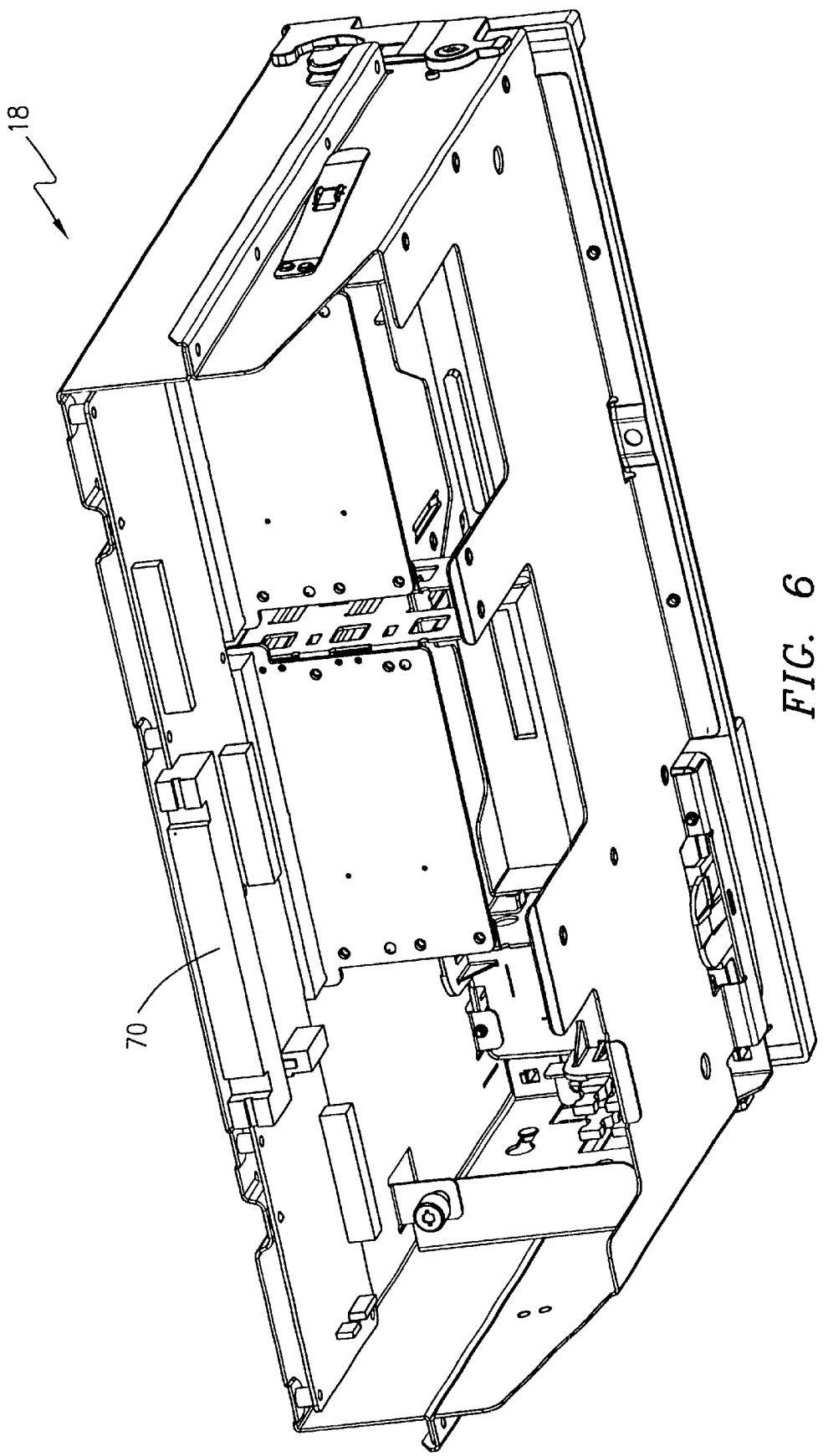
FIG. 6 is a rear perspective view of a media drive module in accordance with the principles of the present invention.

Referring now to FIG. 6, there is illustrated a rear perspective view of media drive module 18. Media drive module 18 includes a media drive module connector 70 which is utilized to interface the components of media drive module 18 with the components of the other modules of chassis 10 as well as to provide power from power supplies 34.

Figure 7:
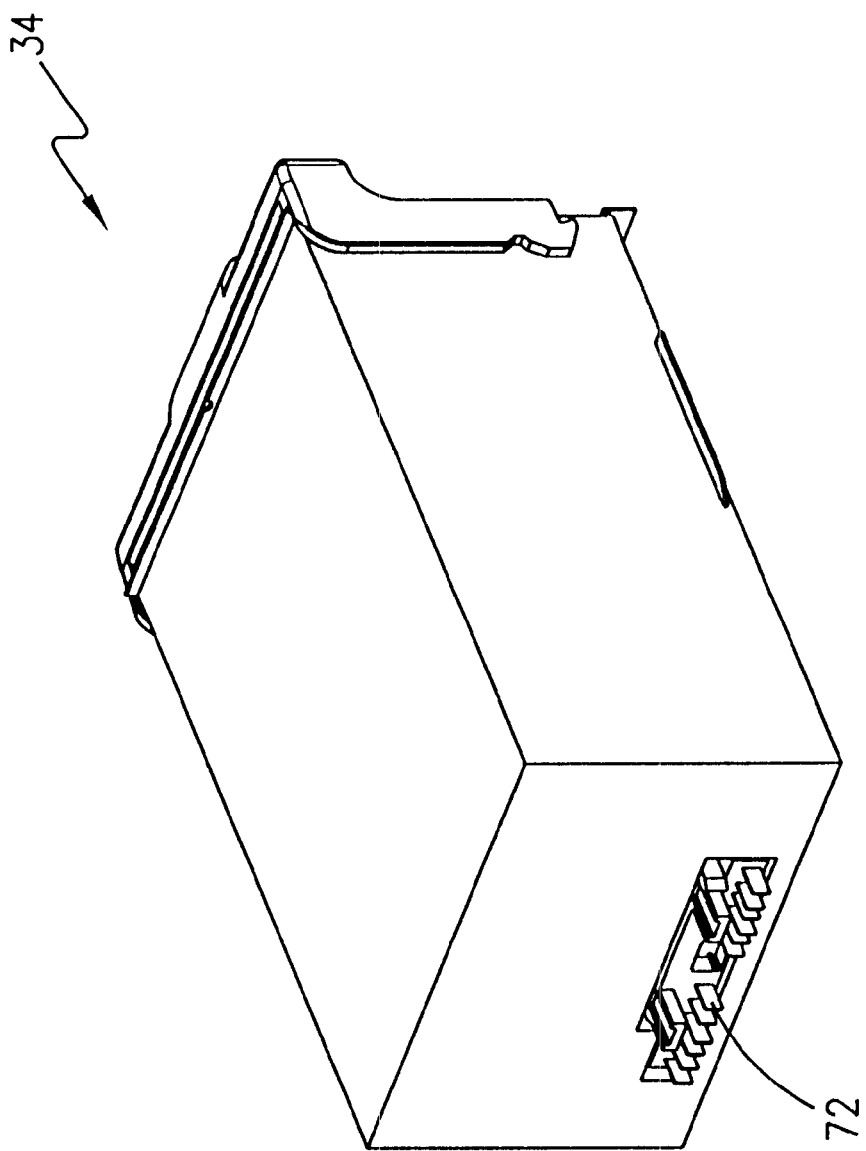
FIG. 7 is a rear perspective view of a power supply in accordance with the principles of the present invention.

Referring now to FIG. 7, there is illustrated a rear perspective view of one of the power supplies 34. Power supply 34 includes a power supply connector 72 which is utilized to interface and supply power to the other components of the other modules of chassis 10.

Figure 8:
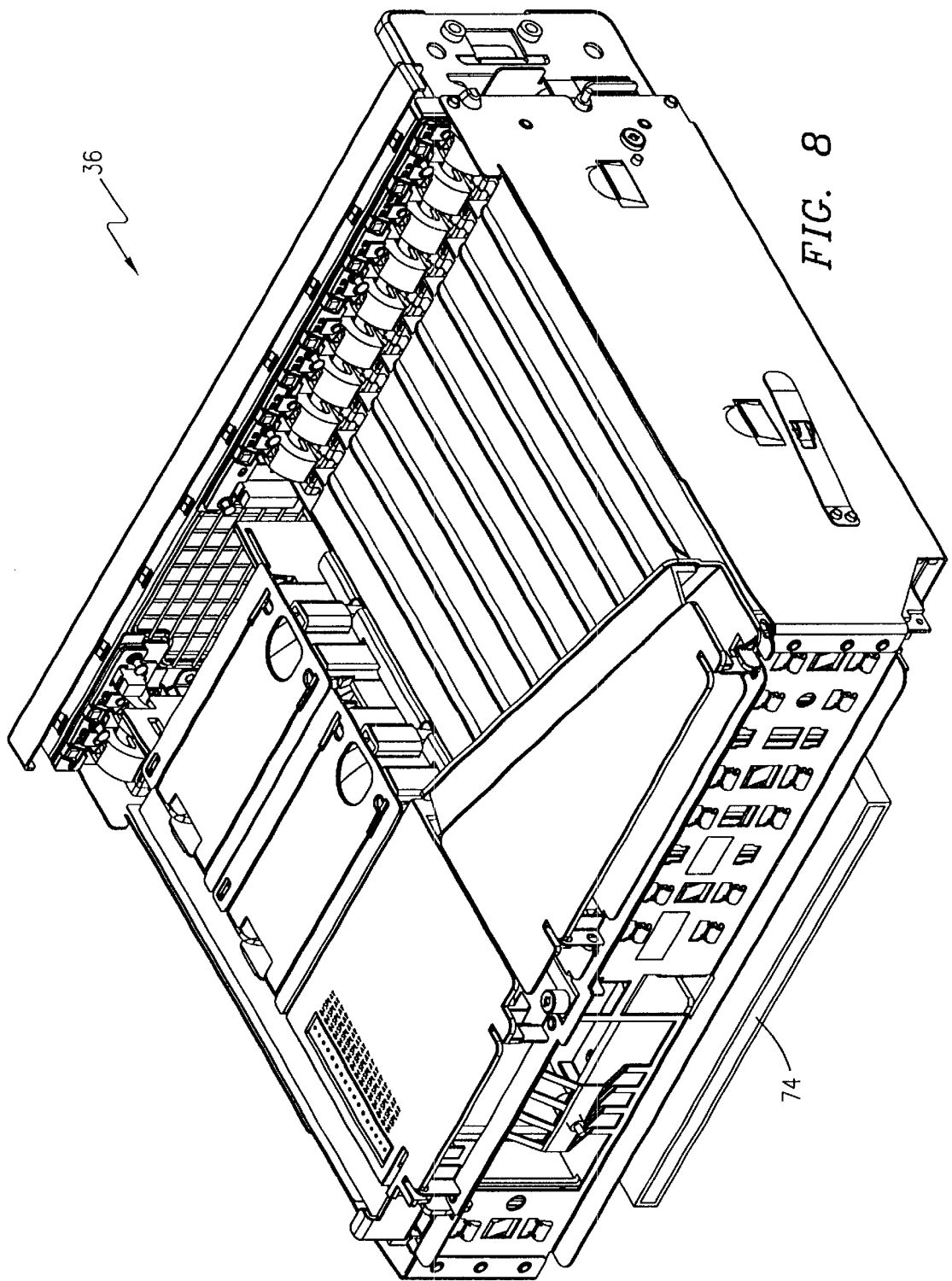
FIG. 8 is a rear perspective view an I/O module in accordance with the principles of the present invention.
Figure 9:
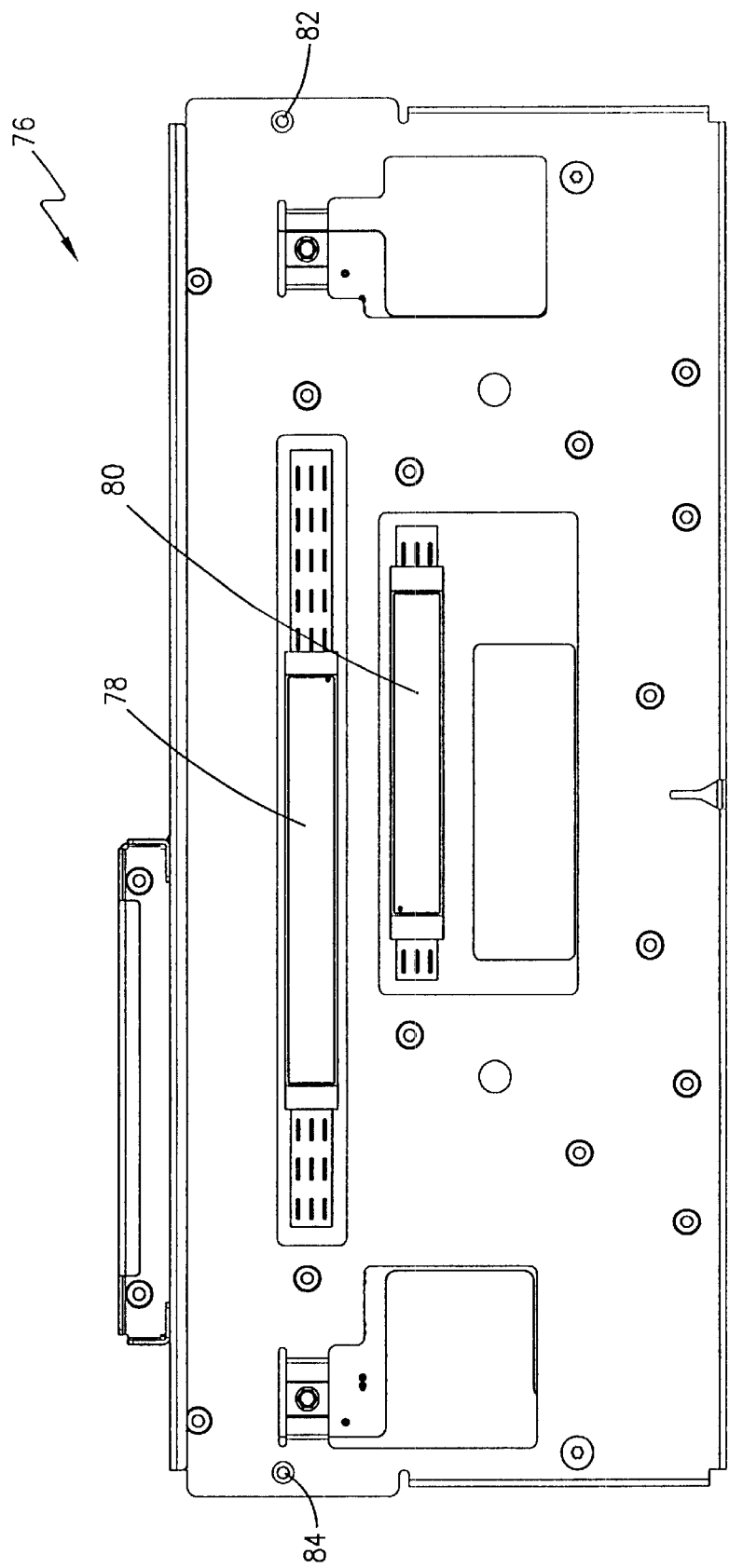
FIG. 9 is a planar front view of a system mid-plane board in accordance with the principles of the present invention.
Figure 10:
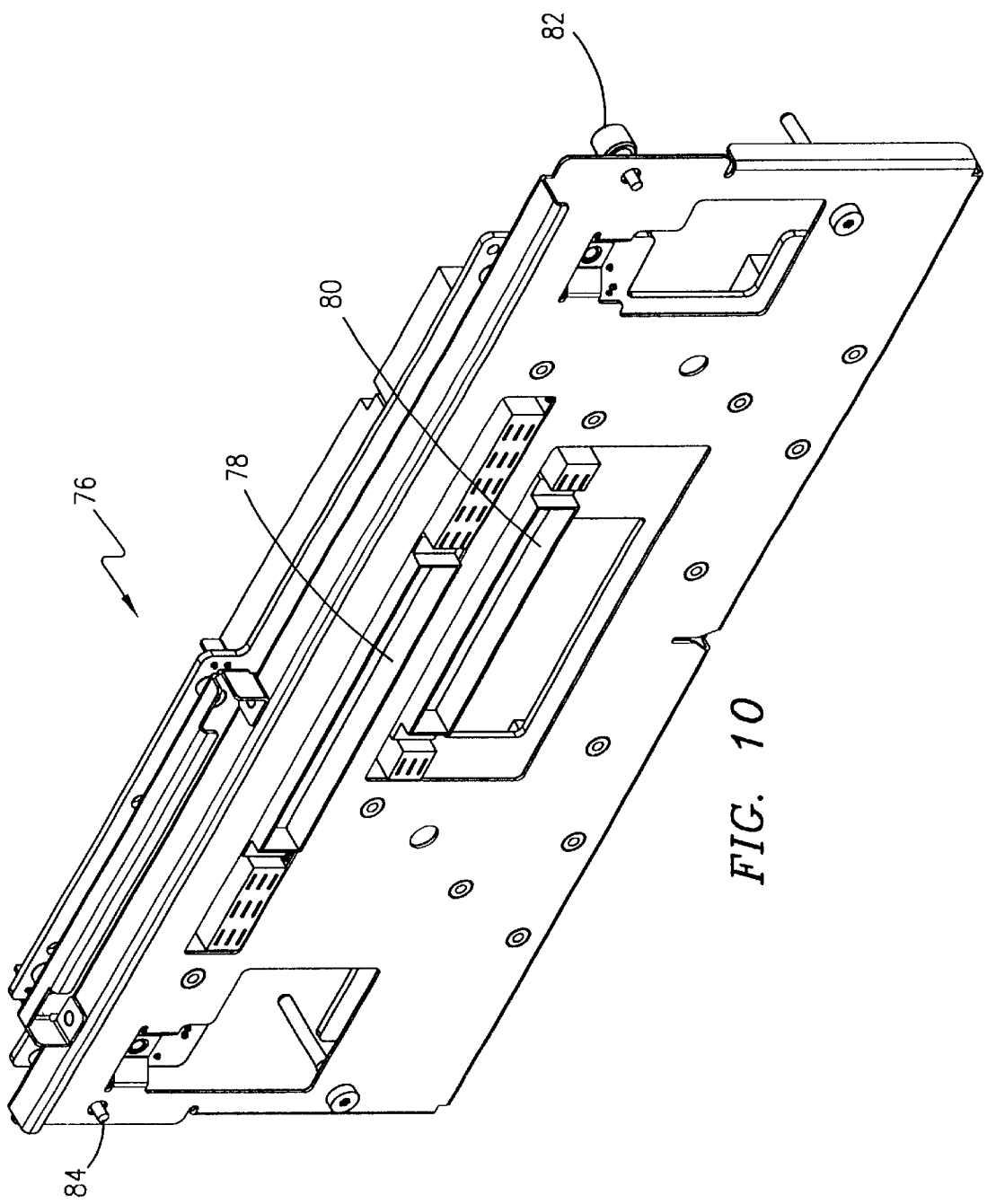
FIG. 10 is a perspective view of a system mid-plane board in accordance with the principles of the present invention as similarly shown in FIG. 9.

Referring now to FIG. 8, there is illustrated a rear perspective view of the I/O module 36. I/O module 36 includes an I/O module connector 74 which is utilized to interface the components of I/O module 36 with the components of the other modules of chassis 10 as well as to provide power from power supplies 34. I/O module 36 further includes display lights 77 which are piped from the error lights 75 from midplane board 76.

Referring now to FIGS. 9–12, there is illustrated an exemplary embodiment of a midplane board 76, e.g. circuit board, utilized in the present invention. Midplane board 76 provides the interface between all of the modules and power supplies within chassis 10. Referring in particular FIGS. 9 and 10 there are illustrated front and front perspective (respectively) views of the midplane board 76. As depicted midplane board 76 includes connectors 78 and 80, and mounting screws 82 and 84. Midplane board 76 is inserted into chassis 10 and secured to center support 44 with mounting screws 82 and 84 which are securable by hand, thereby eliminating any need for tools for the installation and removal therefrom. Connector 78 is in alignment with and receives processor module connector 68 when processor module 16 is inserted into chassis 10. This permits processor module 16 to be plugged directly into midplane board 76. Connector 80 is in alignment with and receives media drive connector 70 when media drive module 18 is inserted into chassis 10. This permits media drive module 18 to be plugged directly into midplane board 76.

Figure 11:
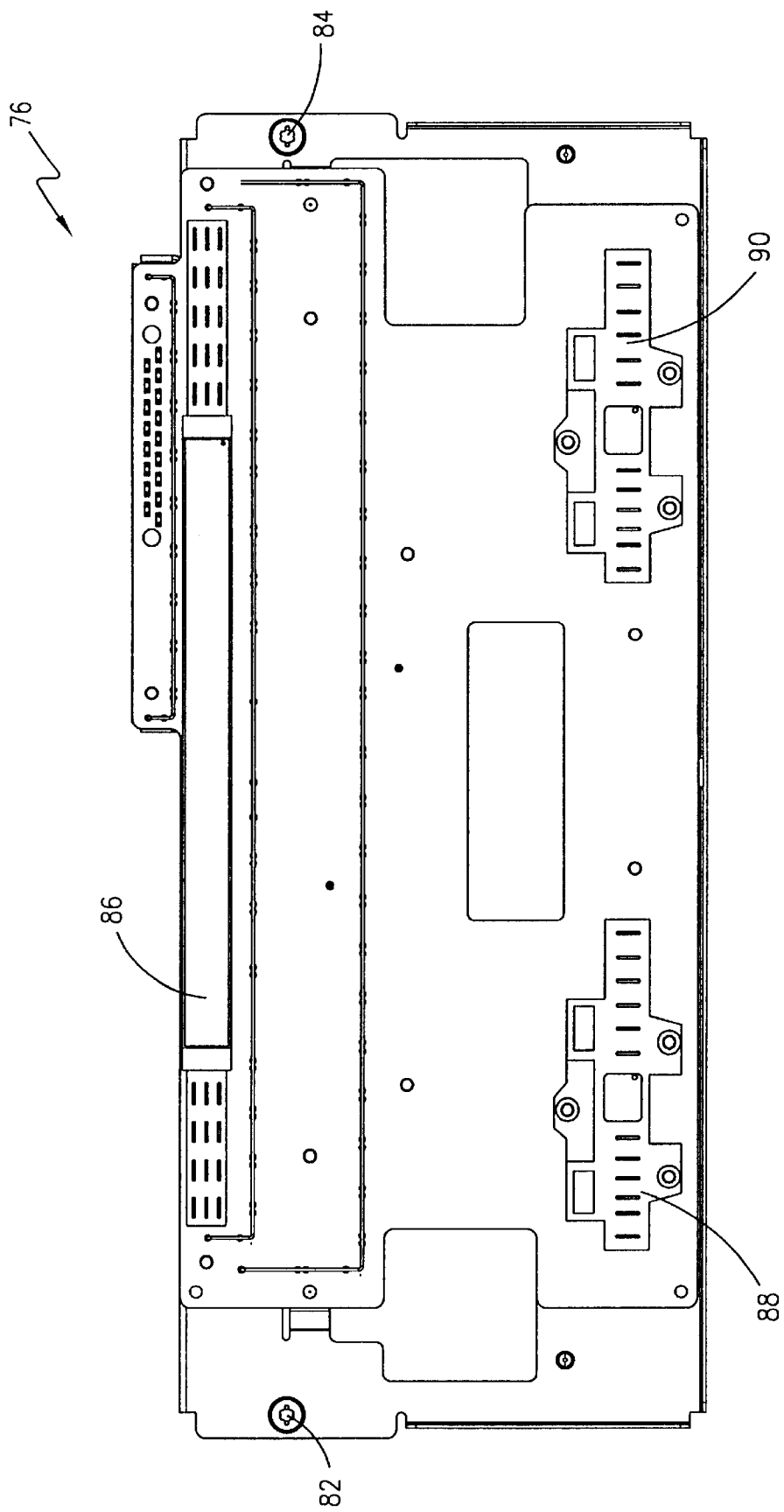
FIG. 11 is a planar rear view of a system mid-plane board in accordance with the principles of the present invention.
Figure 12:
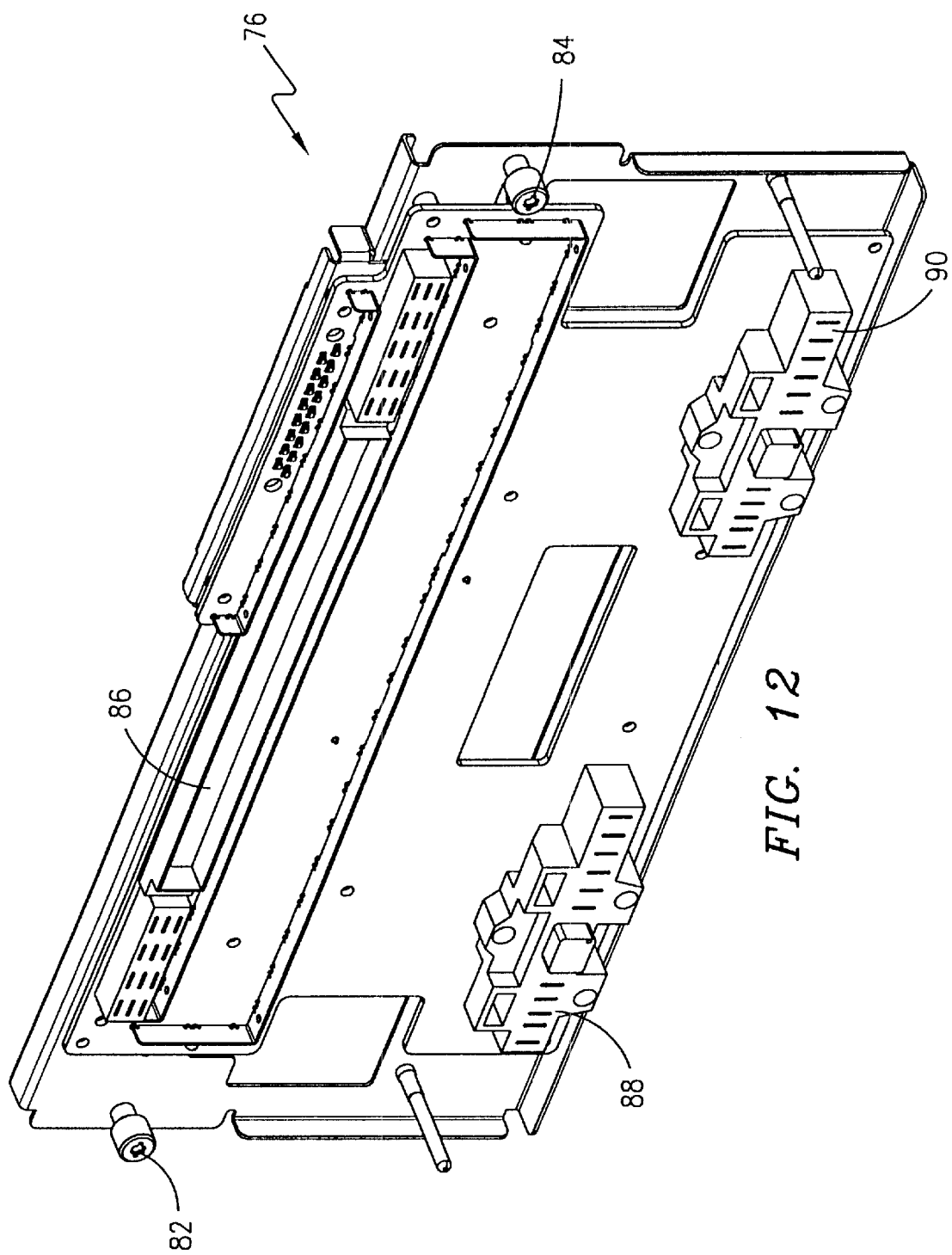
FIG. 12 is a perspective view of a system mid-plane board in accordance with the principles of the present invention; as similarly shown in FIG. 11.

Referring now to FIGS. 11 and 12 there are illustrated rear and rear perspective (respectively) views of the midplane board 76. As depicted midplane board 76 includes error lights 75 and connectors 86, 88 and 90. As described above, midplane board 76 is inserted into chassis 10 and secured to center support 44 with mounting screws 82 and 84. Connector 86 is in alignment with and receives I/O module connector 74 when I/O module 36 is inserted into chassis 10. This permits the I/O module 36 to plug directly into midplane board 76. Connector 88 and 90 are in alignment with and receive power supply connectors 72 when power supplies 34 are inserted into chassis 10. This permits power supplies 34 to plug directly into midplane board 76.

Midplane board 76 is used to directly interconnect all of the modules and their associated components and the power supplies with direct connectors and without any ribbon signal and power cables. The direct connectors facilitate easy assembly and disassembly of the modules from chassis 10, and further permit easy hot-swappability of the power supplies. By not utilizing any ribbon signal and power cables to interconnect the modules and power supplies, a small form factor can be maintained for chassis 10, thereby saving valuable rack mounting space of the chassis 10. By also allowing for easy assembly and disassembly of the modules, the amount of down time for the computer is minimized for repair and/or upgrades of the modules.

Still referring to FIGS. 11 and 12, error lights 75 are utilized to display status and critical error information relating not only to the midplane board 76 but to the computer system as well. For example, error lights 75 are used to indicate whether the power supplies and the other modules are properly inserted into the computer system 10, and further indicate the operating mode of computer system 10. Error lights 75 are piped to the display lights 77 (see FIG. 8) to facilitate user interface.

Therefore, as can be appreciated by one of ordinary skill in the art, the above described invention provides a modularized computer chassis for housing multiple computer modules, such as a processor module, media storage module, an I/O module, and power supplies. The chassis includes a housing divided generally into four regions, with each region configured for receiving either one of the modules or power supplies. A single center pluggable midplane board is positioned in the middle of the housing such that each of the modules and power supplies can be interconnected through the single midplane board. The single center pluggable midplane board includes direct pluggable connectors which correspond to connectors on each of the modules and power supplies, such that each of the modules and power supplies are directly connected to the single pluggable midplane board, and no ribbon signals and power cables needed for the connection. The direct connection between the single center pluggable midplane board and the modules and power supplies helps to minimize the height of the chassis, thereby saving valuable rack space.

Although a preferred embodiment of the apparatus of the present invention has been illustrated in the accompanying Drawings and described in the foregoing Detailed Description, it will be understood that the invention is not limited to the embodiment disclosed, but is capable of numerous rearrangements, modifications and substitutions without departing form the spirit of the invention as set forth and defined by the following claims.

What is claimed is:

1. A processor-based device, comprising:
   a housing;
   at least one circuit board connected to the housing, the at least one circuit board having a plurality of pluggable connectors;
   a processor unit having a processor unit connector;
   a drive unit having a drive unit connector; and
   a power supply unit having a power supply unit connector, wherein the processor unit, the drive unit and the power supply unit may be selectively plugged and unplugged from corresponding connectors of the plurality of pluggable connectors via the processor unit connector, the drive unit connector and the power supply unit connector, respectively.

2. The processor-based device as recited in claim 1, wherein the at least one circuit board comprises a single circuit board.

3. The processor-based device as recited in claim 1, further comprising an I/O module unit having an I/O module unit connector, wherein the I/O module unit may be selectively plugged and unplugged from a corresponding connector of the plurality of connectors.

4. The processor-based device as recited in claim 1, wherein the housing comprises a computer housing.

5. The processor-based device as recited in claim 2, wherein the single circuit board is a midplane circuit board.

6. The processor-based device as recited in claim 5, wherein the processor unit is plugged into the midplane circuit board on an opposite side relative to the power supply unit.

7. The processor-based device as recited in claim 5, wherein the drive unit is plugged into the midplane circuit board on an opposite side relative to the power supply unit.

8. The processor-based device as recited in claim 5, further comprising an I/O module unit having an I/O module unit connector, wherein the I/O module unit may be selectively plugged and unplugged from a corresponding connector of the plurality of connectors.

9. The processor-based device as recited in claim 5, wherein the processor unit is plugged into the midplane circuit board on an opposite side relative to the I/O module unit.

10. The processor-based device as recited in claim 5, wherein the processor unit and the drive unit are both on an opposite side of the midplane circuit board from the power supply unit and the I/O module unit.

11. The processor-based device as recited in claim 6, wherein the drive unit is plugged into the midplane circuit board on an opposite side relative to the power supply unit.

12. A processor-based device, comprising:
    a housing;
    an interface connected to the housing, the interface having a first pluggable connector facing a first direction and a second pluggable connector facing a second direction; and
    a plurality of dissimilar electrical components, wherein a first selected electrical component of the plurality of dissimilar electrical components is coupled to the first pluggable connector and a second selected electrical component of the plurality of dissimilar electrical components is coupled to the second pluggable connector.

13. The processor-based device as recited in claim 12, wherein the first selected electrical component comprises a processor unit.

14. The processor-based device as recited in claim 12, wherein the interface comprises a circuit board.

15. The processor-based device as recited in claim 13, wherein the second selected electrical component comprises a power supply unit.

16. The processor-based device as recited in claim 13, wherein the housing comprises a computer housing.

17. The processor-based device as recited in claim 15, wherein the plurality of dissimilar electrical components comprises a third selected electrical component.

18. The processor-based device as recited in claim 17, wherein the plurality of dissimilar electrical components comprises a fourth selected electrical component.

19. The processor-based device as recited in claim 18, wherein the interface comprises a third and a fourth pluggable connector to pluggably receive the third and the fourth selected electrical components respectively.

20. The processor-based device as recited in claim 19, wherein the third selected electrical component comprises a power supply unit.

21. The processor-based device as recited in claim 20, wherein the fourth selected electrical component comprises an I/O unit.

22. A method for conserving space in a computer chassis, comprising:

deploying a midplane circuit board within a computer housing;

mounting a plurality of stationary electrical connectors to the midplane circuit board;

preparing a processor unit with a stationary processor connector;

preparing an additional electronic component with a stationary component connector; and moving the stationary processor connector and the stationary component connector into mechanical and electrical engagement with corresponding connectors of the plurality of stationary electrical connectors.

23. The method as recited in claim 22, further comprising orienting the plurality of stationary electrical connectors in at least two different directions.

24. The method as reicted in claim 23, wherein orienting comprises placing at least two of the stationary electrical connectors in opposite directions.

25. The method as recited in claim 24, further comprising locating a first divider at a position generally perpendicular to the midplane circuit board between at least two of the plurality of stationary electrical connectors.

26. The method as recited in claim 25, further comprising locating a second divider at a position generally perpendicular to the midplane circuit board between at least two of the plurality of stationary electrical connectors.

27. The method as recited in claim 26, further comprising arranging the second divider to extend from an opposite side of the midplane circuit board relative to the first divider.

28. The method as recited in claim 27, wherein preparing the additional electronic component comprises preparing a drive unit.

29. The method as recited in claim 27, wherein preparing the additional electronic component comprises preparing a power supply unit.

30. The method as recited in claim 27, wherein preparing the additional electronic component comprises preparing an I/O unit.

31. The method as recited in claim 28, further comprising pluggably connecting a power supply unit.

32. The method as recited in claim 28, further comprising pluggably connecting an I/O unit.

* * * * *